United States Patent

La et al.

[11] Patent Number: 5,913,455
[45] Date of Patent: Jun. 22, 1999

[54] APPARATUS FOR RAPID DISPENSING OF MINUTE QUANTITIES OF VISCOUS MATERIAL

[75] Inventors: Duong La, San Diego; Robert L. Ciardella, Encinitas; Alec J. Babiarz, Encinitas; Carlos E. Bouras, Encinitas, all of Calif.

[73] Assignee: Nordson Corporation, Westlake, Ohio

[21] Appl. No.: 08/803,531

[22] Filed: Feb. 20, 1997

Related U.S. Application Data

[60] Continuation of application No. 08/128,525, Sep. 29, 1993, abandoned, which is a division of application No. 07/978,783, Nov. 19, 1992, Pat. No. 5,320,250, which is a continuation-in-part of application No. 07/801,960, Dec. 2, 1991, abandoned.

[51] Int. Cl.⁶ ..................................................... G01F 11/02
[52] U.S. Cl. .......................... 222/55; 222/61; 222/146.5; 222/256; 222/258; 222/259; 222/309; 222/333; 222/321.1; 222/321.6; 222/321.8; 222/420
[58] Field of Search .................................. 222/1, 52, 55, 222/61, 146.5, 207, 214, 252, 256, 257, 258, 259, 309, 320, 321.1, 321.6, 321.7, 321.8, 321.9, 333, 340, 420; 417/413 R; 239/99

[56] References Cited

U.S. PATENT DOCUMENTS

| | | | |
|---|---|---|---|
| 3,329,347 | 7/1967 | Montgomery | 239/583 |
| 3,485,417 | 12/1969 | Cocks | 222/146 |
| 3,690,518 | 9/1972 | Baker et al. | 222/504 |
| 3,811,601 | 5/1974 | Reighard et al. | 222/146 |
| 3,936,030 | 2/1976 | Putschky | 251/129 |
| 4,050,613 | 9/1977 | Corsette | 222/321 |
| 4,264,214 | 4/1981 | Scholl et al. | 366/103 |
| 4,334,637 | 6/1982 | Baker et al. | 222/146 |
| 4,437,488 | 3/1984 | Taggart et al. | 137/334 |
| 4,465,212 | 8/1984 | Boone | 222/504 |
| 4,480,749 | 11/1984 | Laucis et al. | 206/459 |
| 4,488,665 | 12/1984 | Cock et al. | 222/146.5 |
| 4,531,679 | 7/1985 | Pagdin | 239/585 |
| 4,572,103 | 2/1986 | Engel | 118/697 |
| 4,661,368 | 4/1987 | Rohde et al. | 427/8 |
| 4,684,956 | 8/1987 | Ball | 346/1.1 |
| 4,710,399 | 12/1987 | Dennis | 437/245 |

(List continued on next page.)

FOREIGN PATENT DOCUMENTS

| | | |
|---|---|---|
| 0473911 | 3/1992 | European Pat. Off. . |
| WO9112921 | 9/1991 | WIPO . |

OTHER PUBLICATIONS

Nordson Marketing Communication 39 (H–20 and H–200 Filtered Guns) two (2) page brochure dated 1986.
Nordson E–700 Electric Gun two (2) page brochure dated 1989.
Electromatic XV (Solenoid Operated Extrusion Head & Spray Gun) two (2) page brochure (undated).
Electromatic XX (Multiple Outlet Hot Melt Adhesive Applicator) two (2) page brochure (undated).

*Primary Examiner*—Kenneth Bomberg

[57] ABSTRACT

A chamber that communicates with a viscous material reservoir has a flexible resilient diaphragm which forms an exterior wall thereof. An impact mechanism, which may comprise a solenoid actuated hammer, applies a predetermined momentum to the diaphragm for rapidly metering a predetermined minute blob of the viscous material from the chamber through a nozzle. The reservoir is pressurized with gas to force the viscous material into the chamber to refill the same. The chamber is heated to control the viscosity of the material. Dispensing rates in excess of four blobs per second can be achieved. Variations in the height of the nozzle from the surface of the workpiece are not critical to uniform rapid dispensing. An alternate embodiment eliminates the diaphragm and instead rapidly retracts a nozzle relative to a fluid feed conduit to eject very small blobs of viscous material. A strain gauge detects refill of the chamber inside the nozzle and sends a signal to control refill logic circuitry. A fiber optic droplet detector is utilized to correct dispensing defects.

18 Claims, 5 Drawing Sheets

U.S. PATENT DOCUMENTS

| | | | |
|---|---|---|---|
| 4,711,379 | 12/1987 | Price | 222/504 |
| 4,736,704 | 4/1988 | Henniger | 118/688 |
| 4,762,578 | 8/1988 | Burgin, Jr. et al. | 156/64 |
| 4,784,582 | 11/1988 | Howesman, Jr. | 417/490 |
| 4,896,085 | 1/1990 | Jones | 222/333 X |
| 4,951,917 | 8/1990 | Faulkner, III | 251/129.15 |
| 4,962,871 | 10/1990 | Reeves | 222/504 |
| 4,967,933 | 11/1990 | Maiorca et al. | 221/1 |
| 4,985,715 | 1/1991 | Cyphert et al. | 346/140 |
| 5,022,629 | 6/1991 | Tibbals, Jr. | 251/129.02 |
| 5,054,650 | 10/1991 | Price | 222/1 |
| 5,074,443 | 12/1991 | Fujii et al. | 222/639 |
| 5,221,025 | 6/1993 | Privas | 222/333 X |
| 5,320,250 | 6/1994 | La et al. | 222/321 X |

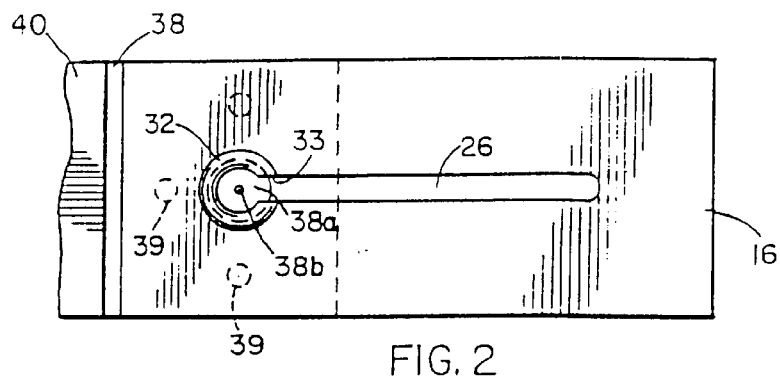
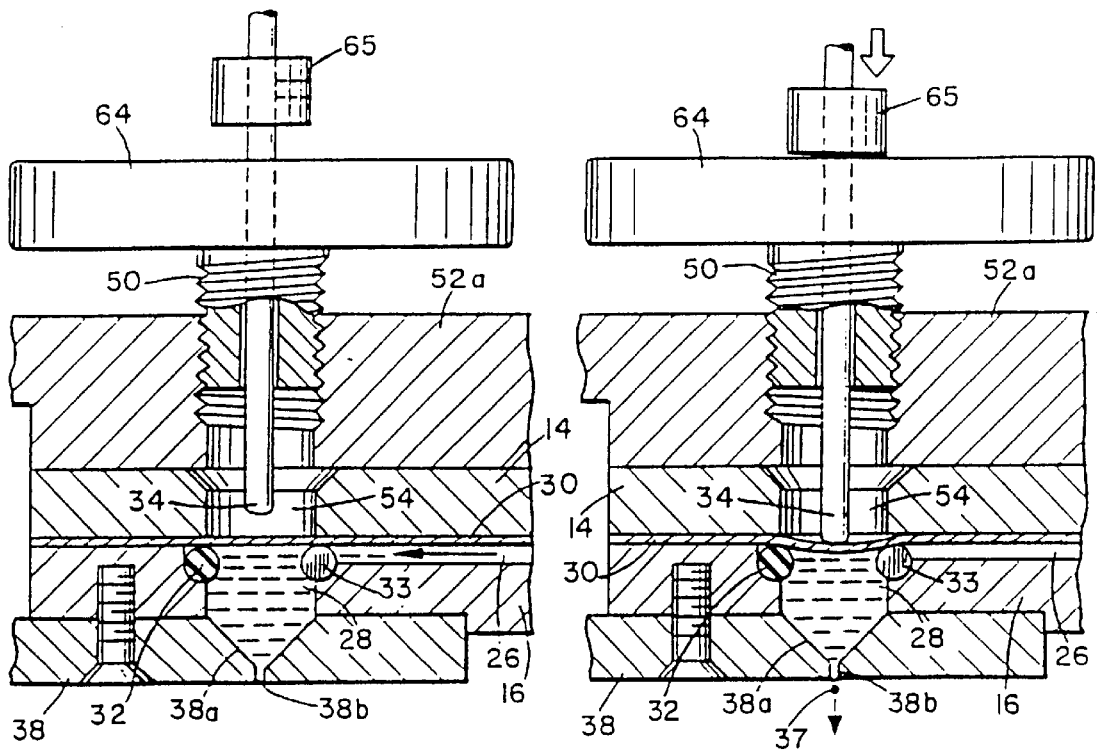
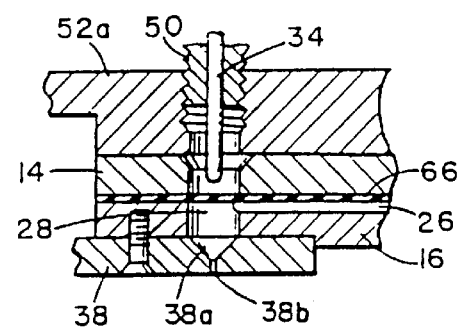

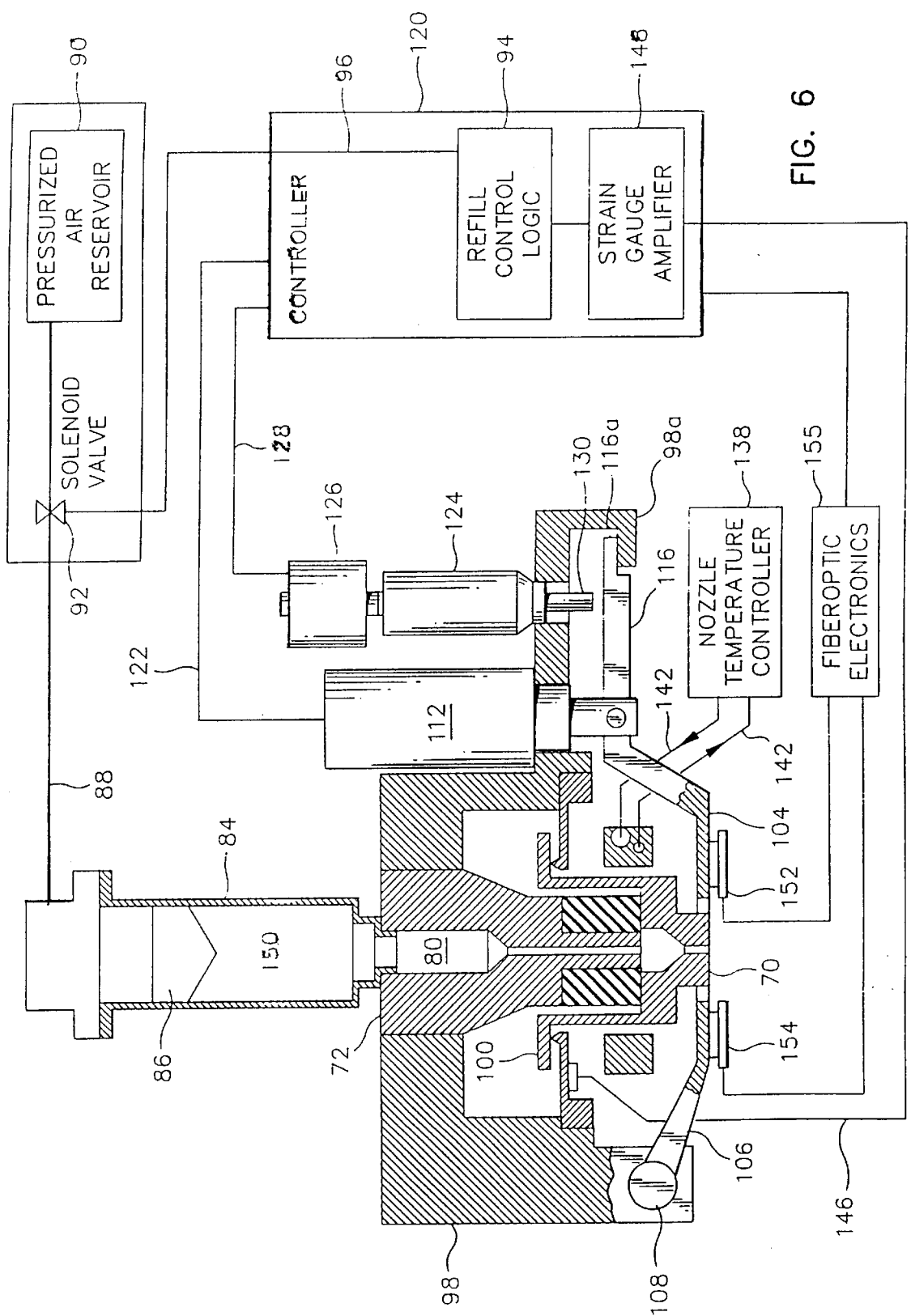

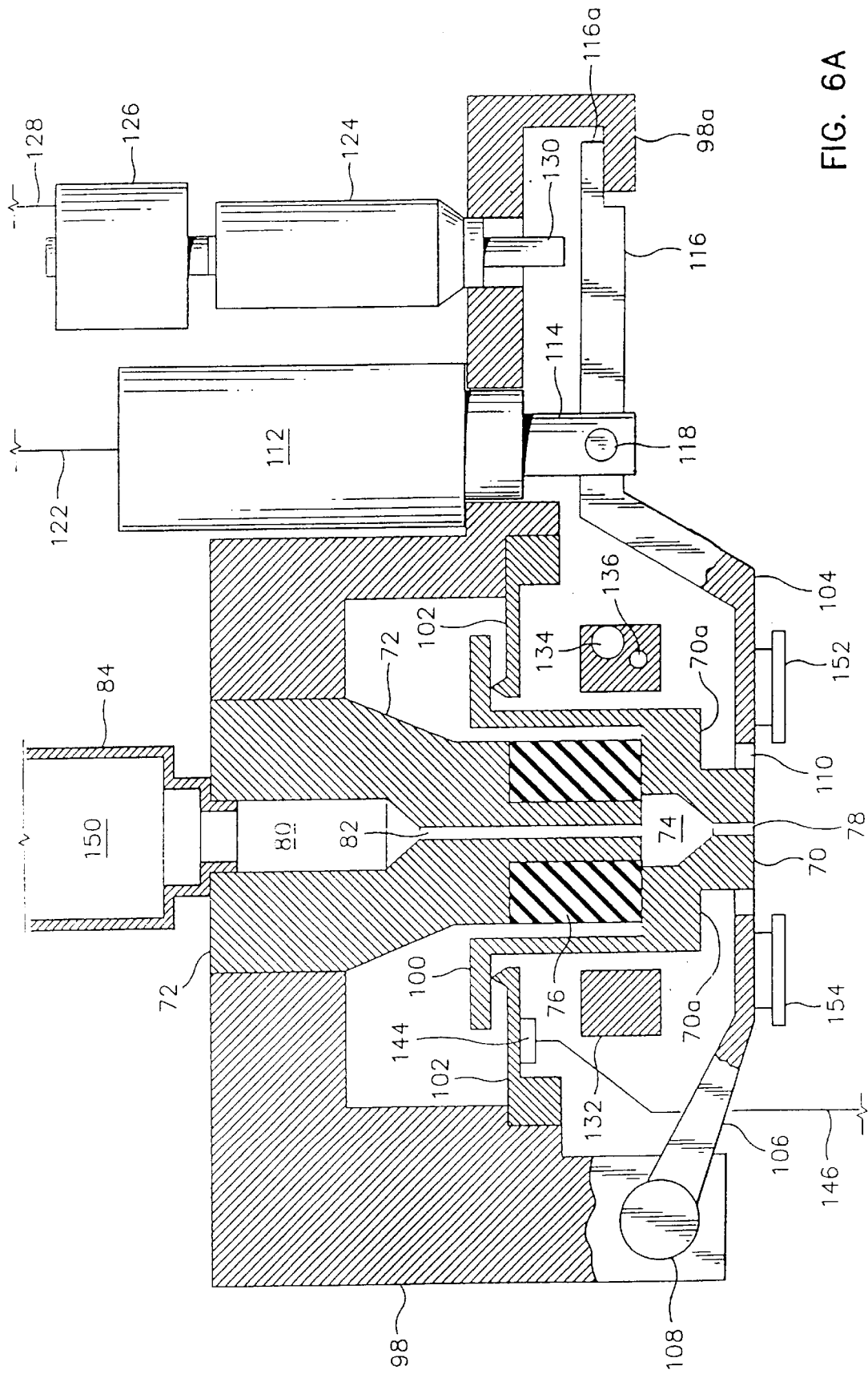

APPARATUS FOR RAPID DISPENSING OF MINUTE QUANTITIES OF VISCOUS MATERIAL

CROSS-REFERENCE TO RELATED APPLICATION

This application is a continuation of application Ser. No. 08/128,525, filed Sep. 29, 1993, now abandoned, which is a divisional of application Ser. No. 07/978,783 filed on Nov. 19, 1992, and issued as U.S. Pat. No. 5,320,250 on Jun. 14, 1994, which is a continuation-in-part of application Ser. No. 07/801,960 filed Dec. 2, 1991 which is now abandoned.

BACKGROUND OF THE INVENTION

The present invention relates to the dispensing of viscous materials, and more particularly, to the rapid dispensing of minute amounts of adhesives in mounting electronic components on circuit boards prior to solder reflow.

In the manufacture of circuit boards it is frequently necessary to apply small amounts of viscous materials, i.e those with a viscosity greater than fifty centipoise. Such materials include adhesives, solder paste, solder flux, solder mask, grease, oil, encapsulants, potting compounds, inks, silicones, RTV and cyanoacrylates. Heretofore the common methods of application have included screening, pin transfer and dispensing from a syringe or valve. Screening requires a template and is not readily adaptable to changing application patterns. Pin transfer is relatively fast but the tooling is intensive and inflexible. Syringe dispensing is widely used and is accomplished with pneumatic mechanisms or positive displacement valves. It is difficult to dispense more than four dots of viscous material per second with a syringe dispenser. It is critical to such dispensers that the height of the needle or other dispensing tip be carefully adjusted relative to the work piece or else the blob of viscous material will be misformed or will not break away from the needle tip. Thus complex height sensing mechanisms are required as shown in U.S. Pat. No. 4,661,368 of Rhode et al., U.S. Pat. No. 4,762,578 of Burgin, Jr. et al., U.S. Pat. No. 4,967,933 of Maiorca et al. and U.S. Pat. No. 5,110,615 of Maiorca et al.

Syringe dispensers usually place the tip very close to the substrate, i.e. 0.005 inches for a very small dot and 0.060 inches for a large dot. The viscous material is pushed out of the tip and contacts the substrate while it is still connected to the tip. If the viscous material fails to contact the substrate, it will not adhere to the substrate and a poorly formed dot will result. The contacting with the substrate is called "wetting." After the viscous material contacts the surface of the substrate, the tip is pulled back and the resulting string is broken to form a dot.

Prior viscous material dispensers have typically included a reservoir, feedpath, pinch points, gates or check valves, a chamber and an exit port. These can prevent rapid flow of viscous materials. They can also become clogged.

It would therefore be desirable to provide an apparatus for rapidly dispensing precisely formed minute quantities of adhesive and other viscous materials, particularly in connection with the attachment of surface mounted electronic components to PC boards prior to solder reflow. This would enable variable patterns of adhesive, such as lines of dots, to be rapidly laid down before placement of the components thereon. It would be further desirable to provide an apparatus for rapidly dispensing minute quantities of adhesive and other viscous materials, particularly in connection with the attachment of surface mounted electronic components to PC boards, that would be insensitive to height variations in the workpiece, such as those attributable to warpage in the PC boards.

SUMMARY OF THE INVENTION

It is therefore the primary object of the present invention to provide an apparatus for rapidly dispensing minute quantities of adhesive and other viscous materials, particularly in connection with the attachment of surface mounted electronic components to PC boards prior to solder reflow.

It is another object of the present invention to provide an apparatus for rapidly dispensing minute quantities of adhesive and other viscous materials, particularly in connection with the attachment of surface mounted electronic components to PC boards, that is insensitive to height variations in the workpiece, such as those attributable to warpage in the PC boards. It is another objective of the present invention to provide a method of high speed ejection of a jet of the highly viscous material, utilizing momentum transfer.

It is another objective of the present invention to provide a method of dispensing viscous material that breaks off the viscous material to form a droplet without the need to "wet" the substrate or work piece, or pull back the dispensing tip.

It is another objective of the present invention to eliminate the use of gates, valves or plugs along the fluid path to control the fluid flow, thereby improving the speed of the dispensing operation and minimizes the chance of clogging.

It is yet another contribution of this invention to make the parts in contact with the viscous material a disposable item to eliminate the need of cleaning viscous material which requires the use of hazardous chemicals.

The present invention also provides an apparatus for rapidly dispensing minute quantities of a viscous material through high speed ejection of a jet of the material. It differs from conventional viscous material dispensers which require a string of material to touch the substrate or work piece before the dispensing tip is pulled back to break off the blob of material.

A first embodiment of our invention includes a reservoir that holds a predetermined volume of a viscous material. A chamber communicates with the reservoir for continuously receiving the viscous material therefrom. The chamber has a flexible resilient diaphragm which forms an exterior wall thereof. An impact mechanism, which may comprise a solenoid actuated hammer, applies a predetermined momentum to the diaphragm to propel a predetermined minute quantity of the viscous material from the chamber through a nozzle at a high velocity. This minute quantity takes the form of a very small jet of fluid. As the impact energy is removed by means of a stop, the sudden decrease of the chamber pressure and the forward momentum of the jet "pinches" the jet to form a droplet, or blob. A critical aspect of the invention for many viscous materials is that the chamber is heated to control the viscosity of the material. The diaphragm may be made of a synthetic material or it may be made of a thin metal sheet. In the latter case, a resilient compressible bumper such as an O-ring is provided under the metal sheet to rapidly restore the original configuration of the sheet after being struck by the hammer. The reservoir is preferably pressurized with gas to force the viscous material into the chamber for the purpose of refilling the chamber. Dispensing rates in excess of four blobs per second can be achieved. Variations in the height of the nozzle from the surface of the workpiece are not critical to uniform rapid dispensing.

A second embodiment of our invention eliminates the diaphragm and instead rapidly retracts a nozzle relative to a fluid feed conduit to eject very small droplets or blobs of viscous material. A strain gauge detects refill of the chamber inside the nozzle and sends a signal to control refill logic circuitry. A fiber optic droplet detector is utilized to detect the presence or absence of the jet.

BRIEF DESCRIPTION OF THE DRAWINGS

FIG. 2 is a top view of the base of the chamber of the first embodiment illustrated in FIG. 1.

FIGS. 3 and 4 are enlarged vertical sectional views illustrating the operation of the impact mechanism of the first embodiment.

FIG. 5 is a vertical sectional view of an alternate form of the chamber of the first embodiment.

FIG. 6 is a part vertical sectional view and part diagrammatic view of a second embodiment of our dispensing apparatus.

FIG. 6A is an enlarged view of the fluid feed conduit, nozzle, impact hammer and adjacent structure of the second embodiment.

DESCRIPTION OF THE PREFERRED EMBODIMENTS

Figure 1:
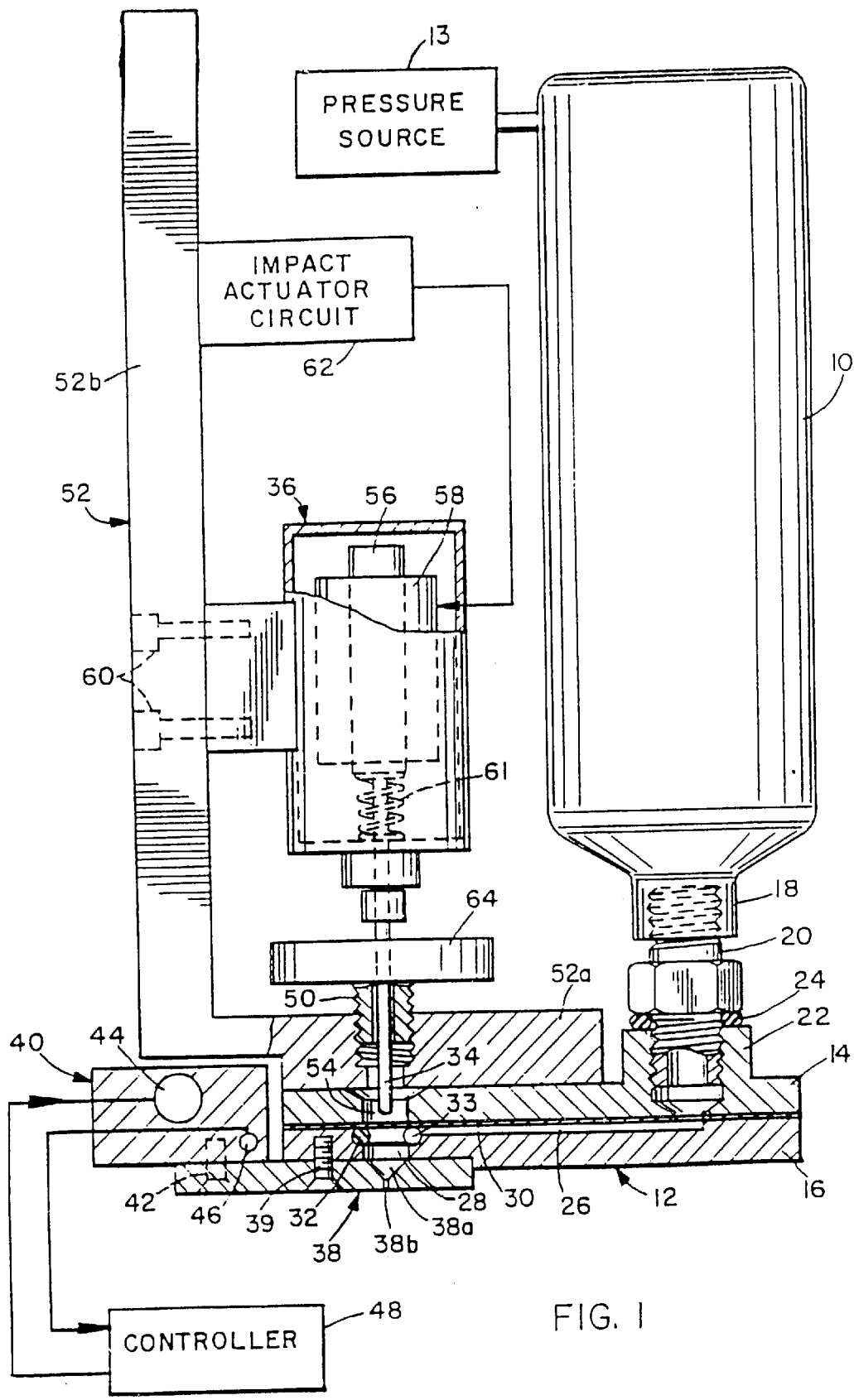
FIG. 1 is a side elevation view of a first embodiment of our dispensing apparatus with portions vertically sectioned.

The first embodiment of our apparatus includes a reservoir such as syringe cartridge 10 (FIG. 1) that holds a predetermined volume of a viscous material. This cartridge is a standard commercially available item. A chamber 12 communicates with the reservoir for continuously receiving the viscous material therefrom. The reservoir is pressurized with gas from a source shown diagrammatically at 13 in order to force the fluid into the chamber. The chamber is formed of a joined rectangular top cover 14 and a rectangular base 16. The cover and base are generally planar and may be machined or molded from suitable plastic material. A female threaded hub 18 of the reservoir screws over a threaded male fitting 20 seated in a cylindrical inlet 22 of the cover 14. An O-ring 24 provides a seal between fitting 20 and inlet 22.

The chamber 12 has an elongate horizontal passage 26 (FIGS. 1 and 2) formed therein which leads from the cylindrical inlet 22 to a stepped cylindrical chamber portion 28. A flexible resilient diaphragm 30 overlies the top of this chamber portion and forms an exterior wall thereof. This diaphragm may be made of a synthetic material such as that sold under the trademark VITON. The VITON sheet may be 0.032 inches thick. In the illustrated embodiment the diaphragm is made of a thin metal sheet such as stainless steel sheet having a thickness of 0.001 inches.

An impact mechanism including a vertically reciprocable hammer 34 actuated by a solenoid 36 applies a predetermined momentum to the diaphragm 30. This causes a predetermined minute quantity (jet of fluid) 37 (FIG. 4) of the viscous material to be rapidly ejected from the chamber through a nozzle 38 forming a high speed jet. A resilient compressible bumper such as a VITON O-ring 32 is provided under the metal sheet 30 to rapidly restore the original configuration of the sheet after being struck by the lower end of a vertical hammer 34. The O-ring has a gap or cut 33 therein (FIG. 2) which is aligned with the passage 26 in the base 16 so that viscous material from the reservoir 10 can re-fill the chamber portion 28.

The nozzle 38 comprises another rectangular piece of stainless steel that overlies the lower surface of the base 16 and is secured thereto by screws 39, only one of which is visible in FIG. 1. The nozzle 38 has an upper conical orifice 38a and a lower cylindrical passage 38b. The orifice 38a communicates with the lower end of the stepped cylindrical chamber portion 28. By way of example, the diameter of the cylindrical passage 38b of the nozzle may measure 0.020 inches or less.

The chamber 12 is preferably heated to control the viscosity of the material dispensed through the nozzle 38. This is accomplished via a heater block 40 (FIG. 1) which is secured to nozzle 38 via screws 42, only one of which is visible in FIG. 1. A resistor 44 and a thermocouple 46 are mounted in correspondingly sized holes which are bored in the heater block 40. The resistor and thermocouple are connected to a controller shown diagrammatically at 48 in FIG. 1. The thermocouple generates a feedback signal representative of the temperature of the heater block and continuously adjusts the level of a heat energizing signal applied to the resistor in order to maintain the heater block, and thus the chamber portion 28 and nozzle 38 at a preselected constant temperature above ambient temperature.

The thermocouple 46 (FIG. 1) is preferably a J-type thermocouple having a pair of Iron and Constantan wires which are physically joined at a sensing junction. The wires are supported in spaced apart, parallel relation inside a cable (not illustrated) which connects the thermocouple junction to the controller 48. The thermocouple junction is in physical contact with the heater block 40 and generates a feedback signal whose current is proportional to the temperature of the block. The resistor 44 may be a standard resistor having a value of, for example, one hundred ohms. The resistor generates heat in proportion to the power of the energizing signal applied thereto. The end terminals of the resistor (not illustrated) are connected via a cable (not illustrated) to the controller 48.

The controller 48 provides a proportional integral differential (PID) control. The controller supplies electric current to the resistor 44 in the heater block 40. The controller 48 reads the temperature from the J-type thermocouple 46 and turns the current to the resistor 44 ON and OFF to maintain a constant temperature in the block 40. A microprocessor in the controller uses a set of response constants for the mass and heat transfer properties of the block 40 in order to control heating time using PID control equations. A constant transfer of heat to the chamber 12 and nozzle 38 from the heater block 40 maintains a constant temperature in the viscous material passing through the nozzle upon energization of the dispensing valve solenoid actuated hammer. The temperature, and thus the viscosity of the viscous fluid is maintained substantially constant despite variations in the rate of delivery through the nozzle.

One suitable temperature controller is the CN9000 Series temperature controller available from Omega Engineering from Stamford, Conn. A suitable power module is also available from the same company for use with the CN9000 Series temperature controller. The CN9000 is a microprocessor based temperature controller, with a user interface which enables set-up by an operator. Selection of operational controls is made through three keys on a front panel. After parameters have been set, they are locked in by removing a jumper located under a front bezel. The operator may select a control mode and a parameter display resolution. The operator may also utilize a ranging feature of the instrument which limits the range in which a set point may be chosen, or lock out the operator from changing the set point. The second set point and output of the CN9000 controller may have proportional or ON/OFF control, and the set point is set as a deviation from the primary set point. Cycle time, proportion band and ON/OFF deadband are set independently of the primary set point.

The hammer 34 (FIG. 1) slides inside of a hollow guide sleeve 50 whose lower end is secured in the vertical bore of an L-shaped mounting bracket 52. A horizontal leg 52a of the mounting bracket is secured to the top of cover 14 of the chamber so that the lower end of the hammer 34 can slide through a hole 54 in the cover to strike the diaphragm 30. The solenoid 36 includes a cylindrical armature 56 mounted to the upper end of the hammer 34. The solenoid further includes a voice coil assembly 58 through which the armature reciprocates. The voice coil assembly is mounted to a vertical leg 52b of the mounting bracket via bolts 60. The hammer is biased by a spring 61 towards a raised position illustrated in FIGS. 1 and 3. An impact actuator circuit shown diagrammatically at 62 is used to apply an impact energizing signal to the solenoid coil 58 to cause the armature 56 to rapidly move downwardly against the bias of the spring 61. This causes the rounded lower end of the hammer 34 to strike the diaphragm 30 as shown in FIG. 4. A stop 64 screws around the outside of the upper end of the guide sleeve 50 and may be rotated to adjust the transfer of momentum, i.e., the depth of the impact of the hammer 34 against the diaphragm. The depth of hammer impact controls the size (volume) of the droplet 37 which is ejected from the chamber.

Dispensing rates in excess of four blobs per second can be achieved with the apparatus just described. Variations in the height of the nozzle from the surface of the workpiece are not critical to uniform rapid dispensing. The droplet 37 is formed without the need of having the viscous material first touch the surface of the workpiece before being lifted away. Consistent, uniform sets of viscous material may be deposited with the preferred embodiment.

FIG. 5 illustrates an alternate form of the first embodiment without the O-ring 32. The diaphragm 30 supplies the resilient force to restore its own planar configuration.

FIGS. 6 and 6A illustrate a second embodiment of our dispensing apparatus which does not use a flexible diaphragm. Instead, in the second embodiment a nozzle 70 is rapidly retracted upwardly relative to a fluid feed conduit 72 in order to eject very small droplets or blobs of viscous material at a high velocity from a drop generation chamber 74 inside the nozzle. The nozzle 70 and the fluid feed conduit 72 are both generally cylindrical. The inner diameter of the drop generation chamber 74 is slightly larger than the outer diameter of the fluid feed conduit 72 so that the former can reciprocate relative to the latter. An elastomeric cylindrical sealing gasket 76 which surrounds the lower portion of the fluid feed conduit 72 forms a seal between conduit 72 and nozzle 70, while allowing relative reciprocating motion between them. Upward reciprocation of nozzle 70 relative to the lower portion of the fluid feed conduit 72 forces the lower end of the feed conduit 72 into the drop generation chamber 74. The lower end of the fluid feed conduit 72 thus acts as a plunger or piston which rapidly reduces the volume of the drop generation chamber 74. This forces a minute quantity of viscous fluid from the drop generation chamber 74 through an exit orifice 78 at a high velocity.

The enlarged upper portion of the fluid feed conduit 72 has a chamber 80 which communicates with the drop generation chamber 74 through a narrow feed passage 82. A conventional dispensing syringe 84 has its lower end screwed into the enlarged upper end of the feed conduit 72 so that the interior of the syringe communicates with the chamber 80. A plunger 86 within the syringe 84 is driven by air delivered via line 88 from a pressurized air reservoir 90. Pressurized air is selectively metered to the syringe 84 via actuation of a solenoid valve 92 connected to a refill control logic circuit 94 via line 96.

The enlarged upper end of the fluid feed conduit 72 is mounted in a hole formed in a frame member 98. The nozzle 70 has an upper radial flange 100. The underside of the flange 100 is normally supported by a plurality of cantilever beams 102. The enlarged outer ends of these beams 102 are connected to the frame member 98. The inner ends of the cantilever beams 102 have upwardly directed triangular shaped projections, the apexes of which contact the underside of the flange 100. An impact hammer 104 has a first end 106 pivotally mounted to the frame member 98 by a pivot assembly 108. The impact hammer 104 has a hole 110 through which the lower end of the nozzle 70 projects.

A solenoid 112 is mounted in a hole in the frame member 98 so that its rod 114 can be connected to a second end 116 of the impact hammer 104 via pin 118. The solenoid 112 is connected to a controller circuit 120 via line 122. The controller 120 can energize the solenoid 112 to pull its rod 114 upwardly. This pivots the impact hammer 104 upwardly in an amount sufficient so that the portions of the hammer surrounding the hole 110 impact the shoulder 70a of the nozzle. This in turn causes the nozzle to suddenly move upward a slight amount, compressing the elastomeric sealing gasket 76.

The distal end 116a of the impact hammer rests on a ledge 98a of the frame member when the solenoid 112 is de-energized to permit the impact hammer to swing downwardly under gravitational force and the restoring force of the sealing gasket 76 and the return spring in the solenoid.

A stroke adjustment micrometer screw assembly 124 is mounted in another hole in the frame member 98 adjacent the solenoid 112. The micrometer screw assembly 124 is driven by a stroke adjustment motor 126. The stroke adjustment motor is also driven by the controller circuit 120 via line 128. The controller circuit 120 can energize the motor 126 to drive the micrometer screw assembly 124 to extend or retract its stop rod 130. This provides an adjustable upper limit for the movement of the impact hammer 104.

The nozzle 70 is in contact with a surrounding heater ring 132. A heating resistor 134 and a thermocouple or thermistor 136 are mounted in holes in the heating ring 132. The resistor 134 and thermistor 136 are connected to a nozzle temperature controller circuit 138 via lines 140 and 142. The nozzle temperature controller circuit 138 precisely regulates the temperature of the nozzle 70 to achieve a predetermined viscosity of the fluid contained within the drop generation chamber 74. This is accomplished by sending the desired amount of current to the heating resistor 134 utilizing feedback control based upon the output signals from the thermocouple 136. Precise regulation of the temperature of the viscous fluid within the drop generation chamber 74 is extremely critical to high speed uniform ejection of droplets of the viscous material.

A strain gauge 144 is connected via line 146 to a strain gauge amplifier 148 which also forms part of the controller circuit 120. When the nozzle 70 descends under both gravitational force and the expansion force of the sealing gasket 76, its radial flange 100 strikes the cantilever beams 102. This causes the strain gauge 144 to generate a signal which is amplified by the strain gauge amplifier 148 and sent to the refill control logic 94. The refill control logic in turn shuts off the pressurized air from the reservoir 90 through line 88 into the syringe 84.

The second embodiment also includes a drop detector in the form of a fiber optic emitter 152 and a detector 154. These components are mounted to the underside of the impact hammer 104 so that the beam from the emitter 152 traverses the hole 110 and is received by the detector 154. The emitter and detector are positioned so that the beam from the emitter is aligned with the exit orifice 78 in the nozzle 70. The emitter and the detector are connected via leads (not illustrated) to the controller 120. Each time a blob or droplet of viscous material is ejected from the nozzle 70, it intercepts the beam from the emitter 152. The detector 154 then sends a signal to the controller 120 via a fiberoptic electronics circuit 155.

Figure 7:
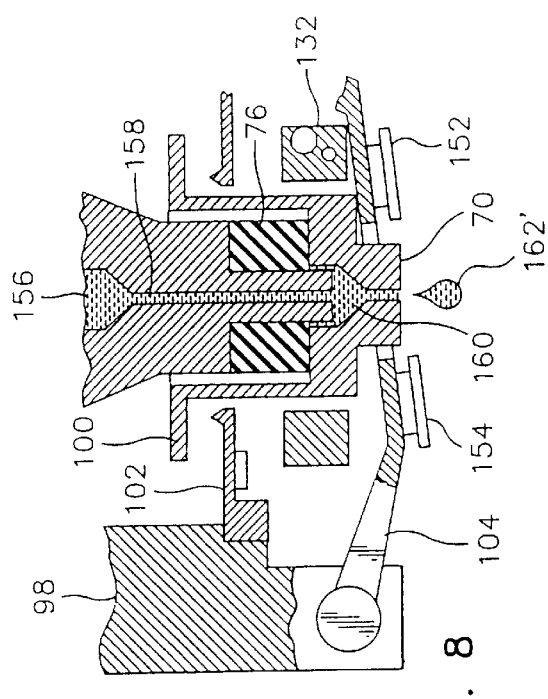
FIGS. 7–10 are a series of enlarged vertical sectional views of the nozzle and surrounding structure of the second embodiment illustrating the formation and ejection of a droplet and the refill of the nozzle chamber.
Figure 8:
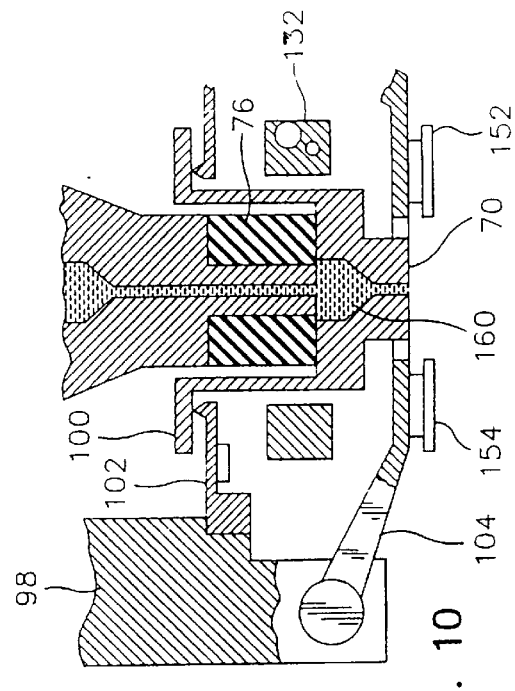
Figure 9:
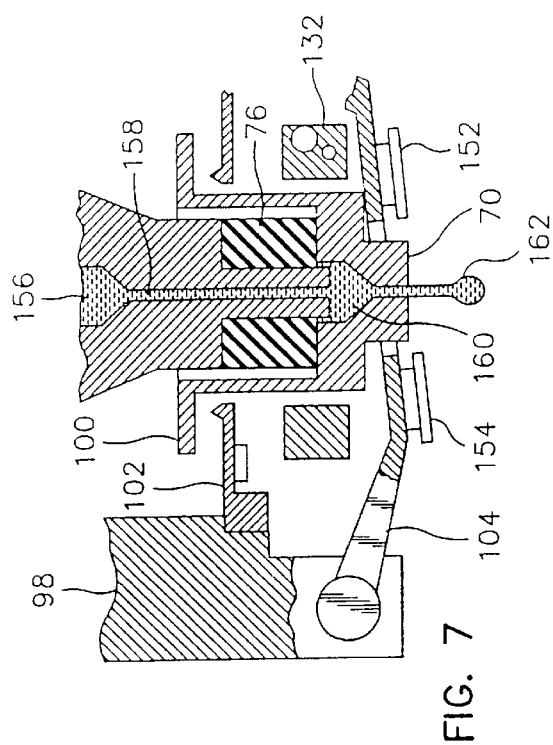
Figure 10:
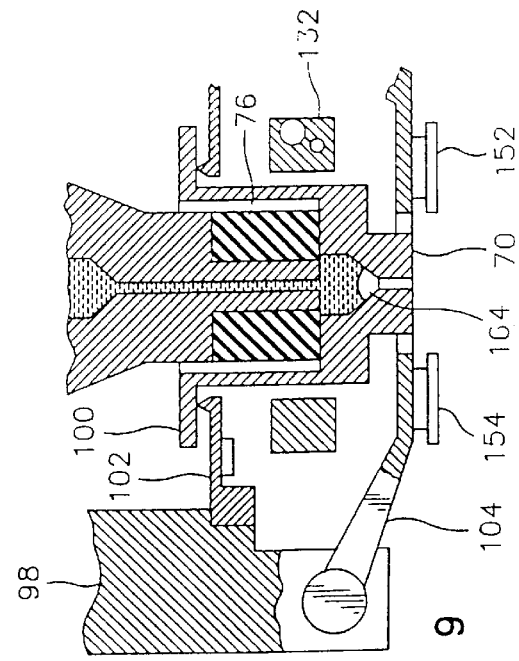

FIGS. 7–9 are a series of enlarged vertical sectional views of the nozzle and surrounding structure of the second embodiment illustrating the formation and ejection of a droplet and the refill of the nozzle chamber. Initially the apparatus is in the state illustrated in FIG. 10. Chamber 80 inside the upper portion of the nozzle 70 is full of viscous fluid 156. The feed passage 82 is filled with viscous fluid 158. The drop generation chamber 74 and the exit orifice 78 in the lower portion of the nozzle 70 are filled with viscous fluid 160. Solenoid 112 is energized by the controller circuit 120. This rapidly pulls the solenoid rod 114 upwardly, pivoting the impact hammer 104 against the shoulder 70a of the nozzle as illustrated in FIG. 7. This moves the nozzle 70 upwardly, slightly compressing the sealing gasket 76. The upward movement of the nozzle 70 rapidly increases the pressure within the drop generation chamber 74. This is because the lower end of the fluid feed conduit 72 is forced into the drop generation chamber 74 and acts as a plunger. Fluid 160 within the drop generation chamber 74 is forced through the exit orifice 78 forming an elongated blob or jet 162. Some of the viscous fluid moves back through the feed path to the fluid reservoir 150 inside the syringe 84. However, the dimensions and configuration of the fluid feed path limit the back-flow rate and force the formation of the jet 162 of the viscous fluid.

The end 116 of the impact hammer hits the stop rod 130 of the micrometer screw assembly 124. This sudden stop of the impact hammer 104 causes a rapid pressure drop inside of the drop generation chamber 74. This pressure drop stops the flow of viscous fluid out of the exit orifice 178. The inertia of the jet of fluid 162 which has already been ejected causes it to break away creating a high velocity droplet 162' (FIG. 8).

Next, the solenoid 112 is de-energized. The expansive force of the sealing gasket 76, the force of the restoring spring in the solenoid 112 and gravitational force cause the impact hammer 104 to rapidly return to its horizontal position illustrated in FIG. 9. At the same time the expansion of the sealing gasket 76, along with gravitational force, causes the nozzle 100 to descend to its position illustrated in FIG. 9. The radial flange 100 of the gasket comes to rest on the apexes of the cantilever beams 102. When the nozzle 70 descends, the lower end of the fluid feed conduit 72 is withdrawn from the drop generation chamber 74. Air is sucked into the exit orifice 78 and into the drop generation chamber 74 creating a void 164. The volume of air taken into the nozzle 70 corresponds to the volume of viscous fluid previously ejected plus the amount of viscous fluid that has flowed back through the feed passage 82 into the chamber 80 inside the upper end of the fluid feed conduit 72.

At this time, the refill control logic circuitry 94 sends a signal via line 96 to open solenoid valve 92. This permits pressurized air from the air reservoir 90 to pass via line 88 into the syringe 84. Plunger 86 is forced down against the viscous material inside the fluid reservoir 150. Viscous material from the syringe is thus driven into the chamber 80 inside the upper end of the fluid feed conduit 72, through the feed passage 82 and into the drop generation chamber 74. The drop generation chamber is thus refilled. The strain gauge 144 detects the pressure rise that occurs when the viscous fluid has refilled the drop generation chamber 74. A signal from the strain gauge 144 is sent via line 146 to the strain gauge amplifier 148. The amplified signal from the strain gauge amplifier is sent to the refill control logic circuit 94 which de-energizes the solenoid valve 92 to shut off the pressurized air from the air reservoir 90. As a verification of correct drop ejection, the detector 154 detects viscous fluid coming out of the nozzle 70 and leaving it as it breaks away to form droplet 162'. Signals from the detector 154 can be used to correct dispensing defects created by incorrect drop ejection that can occur due to the presence of air bubbles in the fluid.

While we have described preferred embodiments of our apparatus for rapid dispensing of minute amounts of viscous materials, it should be understood that modifications and adaptations thereof will occur to persons skilled in the art. For example, the impact actuator circuit could provide an impact energizing signal to the voice coil having a specific duration and profile that will optimize ejection of viscous material from the chamber, through the nozzle. The chamber and/or nozzle could be subjected to sonic vibrations to facilitate ejection of the viscous material. Therefore, the protection afforded our invention should only be limited in accordance with the scope of the following claims.

We claim:

1. An apparatus for rapidly dispensing minute quantities of a viscous material, comprising:

means including a fluid feed conduit for holding a predetermined volume of a viscous material;

nozzle means reciprocable over an end of the fluid feed conduit of the holding means for metering a predetermined quantity of the viscous material from the holding means;

impact means for applying a predetermined momentum to the nozzle means for causing the predetermined quantity of the viscous material to be rapidly ejected from the nozzle means; and electrical heater means thermally coupled to the holding means for heating the viscous material and controlling the viscosity of the viscous material dispensed through the nozzle means upon the application of a heat energizing signal thereto.

2. An apparatus according to claim 1 and further comprising control means for generating a feedback signal representative of the temperature of the electrical heater means and for adjusting a level of the heat energizing signal to maintain the electrical heater means at a preselected constant temperature above an ambient temperature.

3. An apparatus according to claim 1 and further comprising means for detecting the metering of the predetermined quantity of the viscous material by the nozzle means upon application of the predetermined momentum.

4. An apparatus according to claim 1 and further comprising pressurizing means for forcing viscous material from the holding means into the nozzle means.

5. An apparatus according to claim 1 wherein the impact means includes a hammer, means for mounting the hammer for movement toward and away from the nozzle means, and means for causing the hammer to strike the nozzle means.

6. An apparatus for rapidly dispensing minute quantities of a viscous material, comprising:

a fluid feed conduit having an upper chamber and a lower feed passage, the upper chamber and feed passage communicating with each other and extending through the fluid feed conduit;

a nozzle reciprocable over a lower end of the fluid feed conduit and having a drop generation chamber formed therein which communicates with the feed passage, the lower end of the fluid feed conduit acting as a piston to reduce the volume of the drop generation chamber when the nozzle reciprocates upwardly relative to the fluid feed conduit;

reservoir means connected to the upper chamber of the fluid feed conduit for holding a supply of a viscous material;

means selectively energizable for applying pressure to the supply of viscous material within the reservoir means to fill the drop generation chamber of the nozzle with viscous material; and hammer means selectively energizable to strike the nozzle with sufficient force to rapidly reduce the volume of the drop generation chamber to thereby cause a minute quantity of the viscous material to be ejected through an exit orifice at a lower end of the nozzle which breaks away from the nozzle and forms a droplet on a workpiece below, and spaced from, the nozzle.

7. An apparatus for rapidly dispensing minute quantities of a viscous material according to claim 6 wherein the reservoir means includes a syringe coupled to an upper end of the fluid feed conduit.

8. An apparatus for rapidly dispensing minute quantities of a viscous material according to claim 6 and further comprising an elastomeric gasket surrounding the lower end of the fluid feed conduit and deformable upon engagement with the nozzle during upward reciprocation of the nozzle.

9. An apparatus for rapidly dispensing minute quantities of a viscous material according to claim 6 and further comprising heater means surrounding the nozzle for controlling a viscosity of the viscous fluid.

10. An apparatus for rapidly dispensing minute quantities of a viscous material according to claim 6 wherein the hammer means includes an impact hammer, means for mounting the hammer for upward and downward movement to thereby define a stroke of the hammer and motorized means for adjusting the stroke of the hammer.

11. An apparatus for rapidly dispensing minute quantities of a viscous material according to claim 10 wherein the hammer means includes a solenoid connected to the hammer means and engergizable to rapidly move the impact hammer.

12. An apparatus for rapidly dispensing minute quantities of a viscous material according to claim 6 and further comprising means for detecting the ejection of the minute quantity of viscous material from the nozzle and means for energizing the pressure applying means in response thereto.

13. An apparatus for rapidly dispensing minute quantities of a viscous material according to claim 12 wherein the detecting means includes a strain gauge.

14. An apparatus for rapidly dispensing minute quantities of a viscous material according to claim 6 wherein an outer surface of the lower end of the fluid feed conduit is cylindrical and an inner wall of the drop generation chamber of the nozzle is cylindrical and reciprocates around the outer surface of the lower end of the fluid feed conduit.

15. An apparatus for rapidly dispensing minute quantities of a viscous material according to claim 9 wherein the heater means includes a heater ring having a heating element and a heat sensor element mounted therein.

16. An apparatus for rapidly dispensing minute quantities of a viscous material, comprising:

means including a fluid feed conduit for holding a predetermined volume of a viscous material;

nozzle means reciprocable over an end of the fluid feed conduit of the holding means for metering a predetermined quantity of the viscous material from the holding means;

impact means for applying a predetermined momentum to the nozzle means for causing the predetermined quantity of the viscous material to be rapidly ejected from the nozzle means; and means for detecting the metering of the predetermined quantity of the viscous material by the nozzle means upon application of the predetermined momentum.

17. An apparatus of rapidly dispensing minute quantities of a viscous material, comprising:

means including a fluid feed conduit for holding a predetermined volume of a viscous material;

nozzle means reciprocable over an end of the fluid feed conduit of the holding means for metering a predetermined quantity of the viscous material from the holding means;

impact means for applying a predetermined momentum to the nozzle means for causing the predetermined quantity of the viscous material to be rapidly ejected from the nozzle means; and pressurizing means for forcing viscous material from the holding means into the nozzle means.

18. An apparatus for rapidly dispensing minute quantities of a viscous material, comprising:

a fluid feed conduit having an upper chamber and a lower feed passage, the upper chamber and feed passage communicating with each other and extending through the fluid feed conduit;

a nozzle reciprocable over a lower end of fluid feed conduit and having a drop generation chamber formed therein which communicates with the feed passage, the lower end of the fluid feed conduit acting as a piston to reduce the volume of the drop generation chamber when the nozzle reciprocates upwardly relative to the fluid feed conduit;

a reservoir connected to the upper chamber of the fluid feed conduit for holding a supply of a viscous material;

a source selectively energizable for applying pressure to the supply of viscous material within the reservoir to fill the drop generation chamber of the nozzle with viscous material; and a hammer selectively energizable to strike the nozzle with sufficient force to rapidly reduce the volume of the drop generation chamber to thereby cause a minute quantity of the viscous material to be ejected through an exit orifice at a lower end of the nozzle which breaks away from the nozzle and forms a droplet on a workpiece below, and spaced from, the nozzle.

* * * * *